United States Patent

[11] 3,607,267

[72] Inventor Betty Margaret Garrels
Phoenix, Ariz.
[21] Appl. No. 673,704
[22] Filed Oct. 9, 1967
[45] Patented Sept. 21, 1971
[73] Assignee Motorola, Inc.
Franklin Park, Ill.

[54] PRECISION ALIGNMENT OF PHOTOGRAPHIC MASKS
15 Claims, 4 Drawing Figs.

[52] U.S. Cl. .......... 96/27, 96/36.2, 29/407, 29/578, 29/593
[51] Int. Cl. .......... G03c 5/04
[50] Field of Search .......... 96/27, 30, 36.2, 41, 43, 44, 38.1, 38.2, 38.3, 116; 29/578

[56] References Cited
UNITED STATES PATENTS

| | | | |
|---|---|---|---|
| 2,720,146 | 10/1955 | Mears | 96/27 X |
| 2,970,896 | 2/1961 | Cornelison et al. | 29/578 |
| 3,202,509 | 8/1965 | Drake et al. | 96/36.2 |
| 3,245,794 | 4/1966 | Conley | 96/44 |
| 3,288,045 | 11/1966 | Harding | 96/36.2 X |

*Primary Examiner*—George F. Lesmes
*Assistant Examiner*—R. E. Martin
*Attorney*—Mueller & Aichele

ABSTRACT: A photographic mask comprising an array of transparent patterns on an opaque background is provided with a plurality of opaque key images on transparent backgrounds to facilitate precision alignment of the mask within a tolerance limit down to ±0.1 mil or better, limited only by the photographic equipment used for producing the master plate. The opaque key images occupy positions of the same array as said transparent patterns, and also have the same size and shape as the transparent patterns.

PATENTED SEP 21 1971 3,607,267

INVENTOR.
Betty M. Garrels
BY
Mueller, Aichele, & Rauner
Atty's

PRECISION ALIGNMENT OF PHOTOGRAPHIC MASKS

BACKGROUND

This invention relates to the precision alignment of a photographic mask. More particularly, the invention relates to microphotofabrication techniques and to the preparation of a negative photographic mask having a unique configuration of opaque key images on transparent backgrounds.

In the mass production of semiconductor devices several hundred units are typically formed in a single semiconductor wafer by a sequence of processing steps, each of which is carried out simultaneously on all units. In the fabrication of transistors, for example, the base region of each unit is generally formed by a diffusion step in which a predetermined area of each unit is exposed by windows selectively etched in an oxide coating or other diffusion mask on the wafer surface. Subsequently, the emitter regions are formed by diffusion of impurities through windows selectively etched in a masking layer covering the previously diffused base regions.

The window locations in the oxide layers must be located with extreme precision. The photoresist techniques employed to define the areas to be etched involve the use of a photographic mask through which ultraviolet light is passed to expose a precise configuration of the resist composition on a wafer surface, and to leave the window locations unexposed. Thus, the precision with which the emitter windows are located within the base regions is determined by the precision with which a photographic mask can be aligned with respect to the base pattern on the wafer.

After the diffusion steps, the wafer is metallized to provide ohmic contacts for electrode connections to the base and emitter regions, respectively. A typical sequence involves first depositing a metal layer on the entire wafer surface, followed by selective etching to remove the excess, leaving metal at the desired contact areas only.

The selective metal etching is achieved, for example, by coating the metal layer with a negative photoresist composition, then hardening the resist by selective exposure to actinic light at the areas where the metal is to be retained, then washing away the unexposed resist, then etching the unprotected metal, and finally, removing the hardened resist from the metal contact areas.

The precise alignment of such a mask is typically achieved by providing the mask with a set of key images which are completely independent of the array of patterns directly used in device fabrication. The geometry, size and location of the keys are independent of the device pattern, and are placed on the mask by a separate operation, which introduces an additional tolerance restriction.

Both positive masks and negative masks are used in various processing sequences, depending upon the particular requirements of a given process. When using a positive mask, i.e., a mask in which opaque patterns are located on a transparent background, the keys are commonly employed for approximate alignment with the final adjustments made by a direct visual alignment of the mask patterns with the structural patterns of the wafer, as readily visible through the transparent mask background. However, when using a negative mask, transparent patterns are located on an opaque background which, in accordance with the usual practice, requires an operator to depend completely upon the key images for alignment, since the wafer patterns are not visible through the opaque background of the mask.

THE INVENTION

It is an object of the invention to improve the precision and efficiency with which a negative photographic mask can be aligned with the structural patterns of a substrate.

It is a further object of the invention to provide an improved negative photographic mask for the purpose of improving the speed and accuracy with which such a mask can be aligned.

It is a further object of the invention to provide an improved method for the precessing of semiconductor wafers in the manufacture of microelectronic devices.

A primary feature of the invention is the construction of a negative photographic mask to provide key images of positive density. Providing a negative mask with a plurality of transparent areas having opaque key images permits the operator to align with greater ease because of the increased visibility of the substrate through the transparent background of the mask.

In combination with the feature of providing key images having positive density, an additional feature of the invention lies in providing the key images with the same size and shape as the negative images appearing on the "working areas" of the mask. In the manufacture of microelectronic devices, for example, the mask is typically composed of a rectangular array of rows and columns of identical images, each corresponding to a single structural feature to be formed in each of the multiplicity of device units being fabricated. In providing the opaque key images with the same size and shape as the device patterns, it becomes convenient, moreover, to locate the key images in perfect alignment with the columns and/or rows of negative images to be used in the fabrication sequence. Thus, by cutting the device pattern and the key images on the same ruby, assurance is provided that the key images occupy positions of the same array as the device patterns. Of course, the semiconductor unit which lies beneath a key image is lost, but the sacrifice is insignificant in view of the increased yields obtained due to the substantially improved alignment obtained as a result of the invention.

In effect, the mask of the invention permits the operator to employ essentially the same alignment technique when using a negative photographic mask, as has always been convenient in the alignment of a positive photographic mask.

The invention is embodied in a negative photographic mask comprising an array of transparent patterns on an opaque background, and a plurality of opaque key images on transparent backgrounds, said key images occupying positions of the same array, and having the same size as said transparent patterns.

The invention is further embodied in a method for the alignment of a photographic mask including an array of transparent patterns on an opaque background. In order to align the mask with an array of structural patterns on a substrate, the mask is provided with a plurality of transparent areas having opaque key images occupying positions of the same array, and having the same size and shape as the transparent patterns. The mask is then aligned with the substrate by matching the key images with corresponding substrate patterns. The substrate patterns are visible to the operator because of the transparent key image backgrounds, whereas in accordance with prior practice the substrate patterns would not be visible through the opaque backgrounds of the mask.

The invention is further embodied in a method for forming an array of photoresist patterns in precise alignment with respect to an existing array of structural patterns on a substrate. In the manufacture of microelectronic devices the method includes, for example, the step of coating a semiconductor wafer with a negative photoresist, then exposing the resist composition through a negative photographic mask composed of an array of transparent patterns on an opaque background, and also having a plurality of opaque key images on transparent backgrounds of limited areas. The key images are in alignment with the transparent patterns and have the same size and shape as transparent patterns. Next the key images of the mask are aligned with respect to corresponding patterns on the semiconductor wafer. Ultraviolet light is then directed through the mask, whereby the semiconductor wafer is exposed to light transmitted by the mask. The photoresist is then developed by washing away the unexposed resist with a suitable solvent, such as trichloroethylene, for example.

In an alternate embodiment, a negative photographic mask is used in combination with a positive photoresist composition. In this instance, of course, the exposed areas are washed away, leaving the unexposed resist.

THE DRAWINGS

Figure 1:
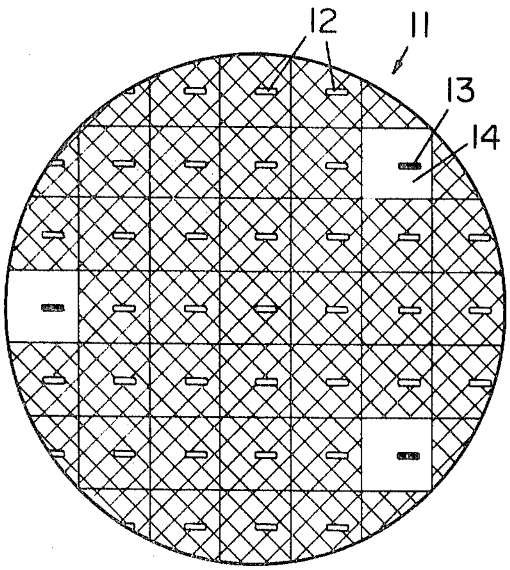
FIG. 1 is a plan view of a photographic mask, illustrating the key images of the invention.

In the drawings cross-hatching is used to indicate opaque areas. In FIG. 1 mask 11 includes transparent areas 12 on an opaque background, and opaque key images 13 on transparent background areas 14. Images 13 occupy positions of the same array as areas 12, and have the same size and shape.

Figure 2:
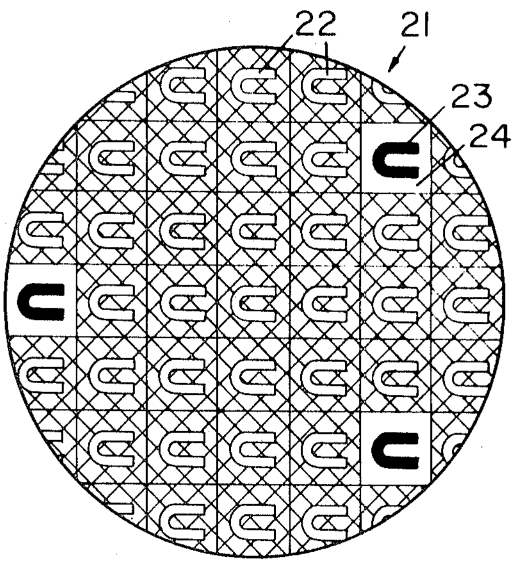
FIG. 2 is a plan view of a second photographic mask illustrating the invention.

Similarly, in mask 21 of FIG. 2 opaque images 23 occupy positions of the same array as transparent areas 22, and have the same size and shape. Background areas 24 are transparent, while the remaining background surrounding areas 22 is opaque.

Figure 3:
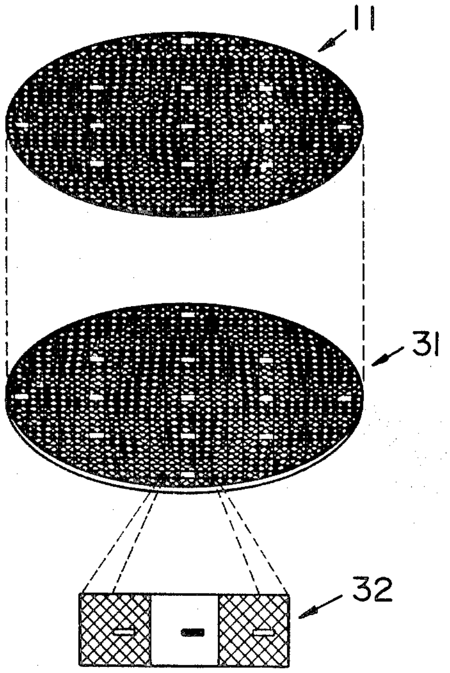
FIG. 3 is a perspective view illustrating the use of a mask as shown in FIG. 1.
Figure 4:
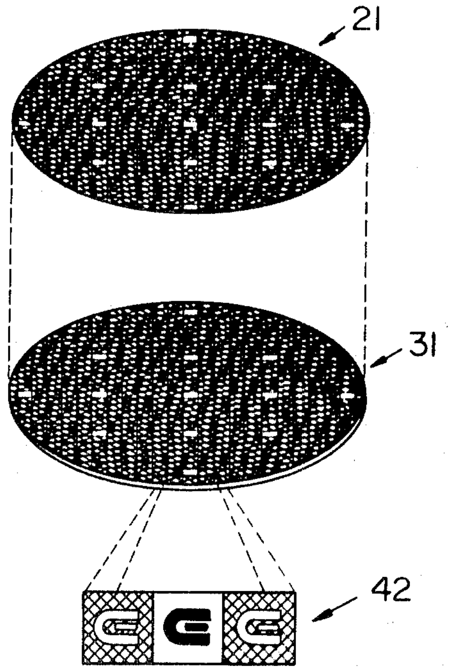
FIG. 4 is a perspective view illustrating the use of a mask as shown in FIG. 2.

In FIG. 3, mask 11 is shown superimposed over metallized and resist-coated semiconductor wafer 31, for which ohmic contacts for transistor base and emitter regions are to be provided. An enlarged portion 32 of wafer 31 is shown, illustrating the exposure pattern which strikes the photoresist layer. After developing the resist to protect the metal under areas 12, a second layer of resist is applied and exposed through the transparent areas of mask 21. Alignment of mask 21 is particularly critical, in order to place the emitter contact areas wholly within the base contact areas, as shown in the enlarged area 42 of wafer 31.

I claim:

1. A method for forming an array of photoresist patterns in precise alignment with respect to an existing array of patterns on a substrate which comprises:

a. coating the substrate with photoresist composition, b. providing a negative photographic mask divided into a plurality of individual areas employed in the formation of images in an equal plurality of individual areas on the substrate and certain of said areas having transparent patterns on an opaque background, and certain others of said areas having opaque key images on transparent backgrounds, c. aligning the key images of said mask with corresponding patterns of said substrate, and d. exposing the substrate to light transmitted by said mask and developing the photoresist.

2. A method as defined by claim 1 wherein said photoresist is a negative photoresist.

3. A method as defined by claim 1 wherein said photoresist is a positive photoresist.

4. A negative photographic mask divided into a plurality of individual areas employed in the formation of images in an equal plurality of individual areas on a member, the improvement comprising:

certain of said areas having transparent patterns on an opaque background; and certain others of said areas having opaque key images on transparent background whereby, those individual areas on the member aligned with said transparent backgrounds having opaque key images are used for alignment purposes.

5. A negative photographic mask being divided into a plurality of individual areas, and employed in the formation of images required in a multiplicity of device units being fabricated in a plurality of individual areas on a semiconductor material, the improvement comprising:

certain of said areas having transparent patterns on an opaque background; and certain others of said areas comprising opaque key images on transparent background whereby, those individual areas on the body of semiconductor material aligned with said areas of said mask having transparent backgrounds and opaque key images are used for alignment purposes.

6. The negative photographic masks as recited in claim 5, wherein; said opaque key images being of the same size ans shape as the transparent patterns.

7. The method of aligning a subsequent photographic mask with an array of patterns formed earlier on a member, comprising:

providing a member and coating said member with a negative photoresist composition;

providing a first negative photographic mask divided into a plurality of individual areas and certain of said areas having transparent patterns on an opaque background, and certain of said remaining areas having opaque key images on transparent backgrounds;

exposing to light, transmitted by said first mask, said photoresist which is covering said member and developing said photoresist aligned under said transparent patterns and transparent backgrounds;

removing said unexposed portions including such photoresist aligned with said opaque keys of said photoresist leaving said transparent patterns and transparent backgrounds on said member;

providing a second layer of negative photoresist over said member;

providing a second negative photographic mask divided into a plurality of individual areas which correspond to said areas of said first mask, and certain of said areas having transparent patterns on an opaque background corresponding to similar areas in said first mask, and certain of said remaining areas having opaque key images on transparent backgrounds corresponding to similar areas in said first mask;

aligning said opaque key images on said second mask with said patterns on said member through said transparent background associated with each such key image on said second mask;

exposing to light, transmitted by said second mask, said second layer of negative photoresist which is covering said member and developing said second layer of photoresist aligned under said transparent patterns and transparent backgrounds; and removing said unexposed portions, including such photoresist aligned with said opaque keys, of said photoresist leaving said transparent patterns and transparent backgrounds on said member.

8. The method of aligning a subsequent photographic mask with an array of patterns formed on a member by a first mask, as recited in claim 7, and further including, prior to the step of providing a second layer of negative photoresist, the step of:

etching at least said surface of said member exposed by the removal of said photoresist aligned with said opaque keys whereby, said pattern on said member is an etched out area.

9. In the manufacture of semiconductor devices in a major surface of a body of semiconductor material requiring a plurality of process steps, each of which performs at least a single step in the process, and each of which is closely related to at least one other step of the process, requiring the predetermined alignment of each step, the method of aligning a subsequent photographic mask used for controlling one step in the process with a pattern formed by a first mask on the major surface, comprising the steps of:

providing a body of semiconductor material having at least a major surface and coating said major surface with a negative photoresist composition;

providing a first negative photographic mask divided into a plurality of individual areas and certain of said areas having transparent patterns on an opaque background, and certain of said remaining areas having opaque key images on transparent backgrounds;

exposing to light, transmitted by said transparent patterns and backgrounds of said first mask, said photoresist which is covering said member and developing said photoresist aligned under said transparent patterns and backgrounds;

removing said unexposed portions, including such photoresist aligned with said opaque keys, of said photoresist leaving said transparent pattern and transparent backgrounds;

providing a second layer of photoresist over said major surface;

providing a second negative photographic mask divided into a plurality of individual areas which correspond to said areas of said first mask, and certain of said areas having transparent patterns on an opaque background corresponding to similar areas in said first mask, and certain of said remaining areas having opaque key images on transparent backgrounds corresponding to similar areas in said first mask;

aligning said opaque key images on said second mask with said patterns on said major surface through said transparent background associated with each such key image on said second mask;

exposing to light, transmitted by said second mask, said second layer of photoresist which is covering said major surface and developing said second layer of photoresist aligned under said transparent pattern and backgrounds; and removing said unexposed portions, including such photoresist aligned with said opaque keys, of said photoresist leaving said transparent patterns and transparent backgrounds on said major surface.

10. The method of aligning a subsequent photographic mask with an array of patterns formed on a major surface of semiconductor material by a first mask, as recited in claim 7, and further including, prior to the step of providing the second layer of photoresist, the step of:

etching at least said surface of said member exposed by the removal of said photoresist aligned with said opaque keys whereby, said pattern on said major surface is an etched out area.

11. The method of aligning a subsequent photographic mask with an array of patterns formed earlier on a member, comprising:

providing a member and coating said member with a positive photoresist composition;

providing a first negative photographic mask divided into a plurality of individual areas and certain of said areas having transparent patterns on an opaque background, and certain of said remaining areas having opaque key images on transparent backgrounds;

exposing to light, transmitted by said first mask, said photoresist which is covering said member and developing said photoresist aligned under said transparent patterns and backgrounds;

removing said exposed portions, including such photoresist aligned with said transparent patterns and transparent backgrounds, of said photoresist leaving said opaque key images and opaque backgrounds on said member;

providing a second layer of positive photoresist over said member;

providing a second negative photographic mask divided into a plurality of individual areas which correspond to said areas of said first mask, and certain of said areas having transparent patterns on an opaque background corresponding to similar areas in said first mask, and certain of said remaining areas having opaque key images on transparent backgrounds corresponding to similar areas in said first mask;

aligning said opaque key images on said second mask with said patterns on said member through said transparent background associated with each such key image on said second mask;

exposing to light, transmitted by said second mask, said second layer of positive photoresist which is covering said member and developing said second layer of positive photoresist aligned under said transparent patterns and transparent backgrounds; and removing said exposed portions, including such photoresist aligned with said transparent patterns and transparent backgrounds of said photoresist leaving said opaque key images and opaque backgrounds on said member.

12. The method of aligning a subsequent photographic mask with an array of patterns formed on a member by a first mask, as recited in claim 11, and further including, prior to the step of providing a second layer of positive photoresist, the step of:

etching at least said surface of said member exposed by the removal of said positive photoresist aligned with said transparent background whereby, said pattern on said member is a raised area protected by said positive photoresist and surrounded by an etched out area.

13. In the manufacture of semiconductor devices in a major surface of a body of semiconductor material requiring a plurality of process steps, each of which performs at least a single step in the process, and each of which is closely related to at least one other step of the process, requiring the predetermined alignment of each step, the method of aligning a subsequent photographic mask used for controlling one step in the process with a pattern formed by a first mask on the major surface, comprising the steps of:

providing a body of semiconductor material having at least a major surface and coating said major surface with a positive photoresist composition;

providing a first negative photographic mask divided into a plurality of individual areas and certain of said areas having transparent patterns on an opaque background, and certain of said remaining areas having opaque key images on transparent backgrounds;

exposing to light, transmitted by said transparent patterns and backgrounds of said first mask, said positive photoresist which is covering said member and developing said photoresist aligned under said transparent patterns and backgrounds;

removing said exposed portions, including such photoresist aligned with said transparent patterns and transparent backgrounds of said photoresist, leaving said photoresist aligned under said opaque key images and opaque backgrounds on said major surface;

providing a second layer of positive photoresist over said major surface;

providing a second negative photographic mask divided into a plurality of individual areas which correspond to said areas of said first mask, and certain of said areas having transparent patterns on an opaque background corresponding to similar areas in said first mask, and certain of said remaining areas having opaque key images on transparent backgrounds corresponding to similar areas in said first mask;

aligning said opaque key images on said second mask with said patterns on said major surface through said transparent background associated with each such key image on said second mask;

exposing to light, transmitted by said second mask, said second layer of positive photoresist which is covering said major surface and developing said second layer of positive photoresist aligned under said transparent pattern and backgrounds; and removing said exposed portions including such photoresist aligned with said opaque keys, of said photoresist leaving said transparent patterns and transparent backgrounds on said major surface transparent patterns and transparent backgrounds, of said positive photoresist leaving opaque key images and opaque backgrounds,.

14. The method of aligning a subsequent photographic mask with an array of patterns formed on a major surface of a semiconductor material by a first mask, as recited in claim 13, and further including, prior to the step of providing the second layer of positive photoresist, the step of:

etching at least said surface of said member exposed by the removal of said positive photoresist aligned with said transparent background whereby, said pattern on said major surface is a raised area protected by said positive photoresist and surrounded by an etched out area.

15. A method as recited in claim 1, wherein said key images occupy positions of the same array and being the same size and shape as said transparent pattern.